United States Patent [19]

Galbraith et al.

[11] Patent Number: 4,918,341
[45] Date of Patent: Apr. 17, 1990

[54] HIGH SPEED STATIC SINGLE-ENDED SENSE AMPLIFIER

[75] Inventors: Douglas C. Galbraith, Fremont; Michael G. Ahrens, Sunnyvale, both of Calif.

[73] Assignee: Actel Corporaton, Sunnyvale, Calif.

[21] Appl. No.: 230,764

[22] Filed: Sep. 23, 1988

[51] Int. Cl.⁴ .................. H03F 3/45; H03K 19/094
[52] U.S. Cl. ............................. 307/530; 307/451; 307/279; 365/205; 365/207
[58] Field of Search ............... 307/443, 448, 451, 530, 307/279, 542–543, 263; 365/203, 205, 207, 222

[56] References Cited

U.S. PATENT DOCUMENTS 4,354,257 10/1982 Varshney et al. ............... 365/207
4,724,344 2/1988 Watanabe ........................ 307/530

Primary Examiner—Stanley D. Miller
Assistant Examiner—Margaret Rose Wanbach
Attorney, Agent, or Firm—Lyon & Lyon

[57] ABSTRACT

A high speed static single ended sense amplifier is disclosed, including, an input node, an output node, a first P-channel input transistor having its source connected to a source of positive voltage, its drain connected to the input node and its gate connected to a feedback node, a first N-channel input transistor having its drain connected to the input node, its source connected to a source of negative voltage and its gate connected to the feedback node, a first output P-channel transistor having its source connected to a source of positive voltage, its drain connected to the output node, and its gate connected to the feedback node, a first N-channel output transistor having its drain connected to the output node, its source connected to a source of positive voltage and its gate connected to the feedback node, an N-channel feedback transistor having its gate connected to the output node, its drain connected to a source of positive voltage and its source connected to the feedback node, a capacitive voltage divider connected between the source of negative voltage, the source of positive voltage, and the input node, the capacitive voltage divider including a parasitic capacitance and a P-channel gate capacitor connected between the input node and one of the positive or negative voltage sources, the capacitance ratio of the capacitive voltage divider being such as to give the same voltage divider ratio as the voltage divider ratio resulting from the first P-channel MOS input transistor and the first N-channel MOS input transistor.

3 Claims, 1 Drawing Sheet

HIGH SPEED STATIC SINGLE-ENDED SENSE AMPLIFIER

BACKGROUND OF THE INVENTION

1. Field Of The Invention

The present invention relates to integrated circuits. More particularly, the present invention pertains to sense amplifiers circuits for use in memory integrated circuits.

2. The Prior Art

Single-ended sense amplifiers are commonly used in commodity read only memories and programmable read only memories to detect the presence or absence of a programmed memory cell. Two common examples of single-ended sense amplifier commonly in use today are shown in FIGS. 1 and 2. In the circuit of FIG. 1, the single-ended sense amp is simply an inverter. It requires a relatively large input signal (several volts), produced by the memory cell to switch its output between ground and Vdd. This large input swing significantly slows the operation of the memory product in which this circuit is embodied because the weak memory cell current, 10-100 microamps, must drive a large load, typically 5-10 picofarads (due to many memory cells on a common bit line, and many pass devices on a common I/O line). Therefore, this sense amplifier is only suited for slow designs.

The single-ended sense amplifier depicted in FIG. 2 is a current to voltage converter. It passes the cell current through a resistor, synthesized with P-channel Mos device P1, to convert the current into a voltage. The feedback circuitry, $P_2$, $P_3$, $N_2$ and $N_3$ establishes the voltage bias level of the I/O and bit line. A feedback clamp $N_2$ holds the bias level of the I/O line when a bit line is initially accessed. Once the bit line bias has stabilized, the clamp is released and sensing begins. The feedback also squares up the output voltage by amplifying the effect of the I/O voltage movement on the $V_{gs}$ of the N-channel MOS device $N_1$.

The sense amplifier of FIG. 2 can detect a few hundred millivolts of signal swing, so it is capable of higher speeds than the inverter sense amplifier of FIG. 1. However, the sense amplifier circuit of FIG. 2 still wastes some speed, and suffers from power supply noise sensitivity.

Speed is lost due to the feedback loop, clamp circuit and lowering the noise sensitivity. The feedback loop adds additional stage delays between the I/O signal and the switching of N1, which slows the squaring of the output voltage. The clamp circuit and sense amp trip points are different, so time is wasted while the I/O line moves between them.

Speed is lost also due to the power supply noise sensitivity of the trip point of the sense amplifier. Since the trip point of the feedback circuit is a function of the power supply voltage, variations in the power supply voltage will affect when N1 switches. The clamp circuit will re-establish the I/O and bit line bias levels if Vdd increases, but must rely on the weak cell current to pull the I/O and bit line down if Vdd becomes lower. Both equalization processes slow the sensing process. Thus, while this sense amplifier of FIG. 2 operates with a smaller signal, and is consequently faster than the inverter sense amp depicted in FIG. 1, it still suffers from power supply noise sensitivity and is still relatively slow.

BRIEF DESCRIPTION OF THE INVENTION

The high speed, static, single-ended current mirror sense amplifier of the present invention is faster than the prior art sense amplifiers and does not suffer from the power supply noise sensitivity of the current to voltage converter. The sense amplifier of the present invention uses complementary current mirrors to convert a single-ended input current into a single-ended output voltage. The current mirrors are unbalanced. With no input current, one output mirror will consume more current than its complement, and the output voltage will assume a voltage value near to that of one of the output supplies. The imbalance is adjusted so that the minimum input current can overcome the offset and switch the output voltage to the opposite supply.

The circuit of the present invention employs a feedback clamp to prevent the I/O line from moving after the output has switched. The clamp trip point is the same as the sense amplifier trip point, so time is not wasted while the I/O line moves between the clamp and sense amplifier trip points.

The circuit of the present invention uses a capacitive voltage divider between the power supplies and the I/O line to cancel high frequency voltage supply noise. The capacitive voltage division is adjusted to equal the current mirror voltage division. If the voltage supply experiences a noise spike, the capacitive divider moves the I/O bias voltage so that it tracks the trip point of the current mirrors. Therefore, the noise spike will not trip the sense amplifier, nor is time waste in reestablishing bias levels.

DETAILED DESCRIPTION OF A PREFERRED EMBODIMENT

Figure 3:
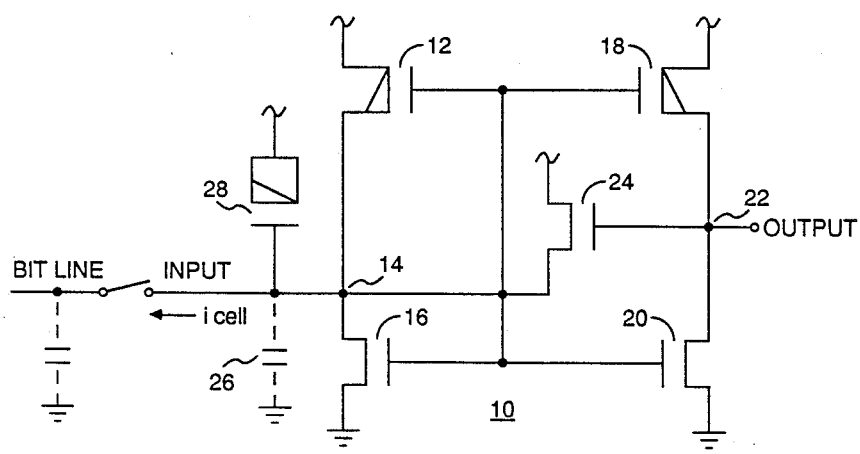
FIG. 3 is a schematic diagram of a high speed static single-ended current mirror sense amplifier according to the present invention.

A preferred embodiment of the high-speed, static, single-ended current-mirror sense amplifier of the present invention is shown in FIG. 3. Sense amplifier 10 includes a first P-channel MOS transistor 12 having its source connected to a source of positive voltage VDD and its drain connected to an input node 14. A first N-channel MOS transistor 16 has its drain connected to input node 14 and its source connected to a source of negative voltage Vss. The gates of first P-channel MOS transistor 12 and first N-channel MOS transistor 16 are connected together to input node 14. Second P-channel MOS transistor 18 and second N-channel MOS transistor 20 form current mirrors with first P-channel MOS transistor 12 and second first N-channel MOS transistor 16. Second P-channel MOS transistor 18 has its source connected to VDD and its drain connected to output node 22. Second N-channel MOS transistor 20 has its drain connected to output node 22 and its source connected to Vss. The gates of both second P-channel MOS transistor 18 and second N-channel MOS transistor 20 are connected to input node 14.

First P-channel transistor 12 and first N-channel transistor 16 should be sized such that the bias current through them is from between approximately one times the cell current to approximately twenty times the cell current. Beyond these ranges, at the low end speed will deterioate, and at the high end noise margin will deteriorate. In addition, the transistors 12 and 16 form a voltage divider which determines the bit line voltage These devices should be sized to set the voltage of the bit line high enough to achieve the desired cell current.

The ratio of the first stage (first P-channel MOS transistor 12 and first N-channel MOS transistor 16) to the second stage (second P-channel MOS transistor 18 and second N-channel MOS transistor 20) will affect the operation of the sense amplifier of the present invention. This ratio sets the trip point of the sense amplifier. Preferrably the trip point should lie in the approximate center of the range of current the cell can produce. Otherwise, noise margin will be sacrificed. If the ratio of first P-channel MOS transistor 12 and first N-channel MOS transistor 16 is one to one and the ratio of second P-channel MOS transistor 18 to second N-channel MOS transistor 20 is one to two, the voltage at input node 14 will be approximately Vdd/2 with no cell current flowing out of input node 14. This voltage will appear on the gates of all of the transistor devices 12, 16, 18, and 20. Because of the one to two ratio of the sizes of second P-channel MOS transistor 18 and second N-channel MOS transistor 20, the N-channel output transistor 20 can sink twice the current that P-channel output transistor 18 can supply, so output node 22 will be at a low voltage.

When a memory cell is connected to input node 14 and draws current, more current will flow through first P-channel MOS transistor 12 than will flow through first N-channel MOS transistor 16 and the voltage at input node 14 will fall. Since input node 14 provides the gate voltages for second P-channel MOS transistor 18 and second N-channel MOS transistor 20, second P-channel MOS transistor 18 will be turned on more heavily, and second N-channel MOS transistor 20 will be turned on less heavily. As a result, the voltage at output node 22 will rise. The output voltage at output node 22 will rise to approximately 3 volts because the clamp transistor 24 will turn on when the output voltage is approximately $1V_t$ above the input voltage.

As the voltage on input node 14 falls and the voltage on output node 22 rises, the gate to source voltage on N-channel clamp transistor 24 reaches a value which will turn on N-channel clamp transistor 24. N-channel clamp transistor 24 will clamp the voltage at output node 22 to one voltage threshold above whatever voltage is on input node 14. N-channel clamp transistor 24 must be large enough to rapidly pull up the bit line when it is connected to the input.

The main function of N-channel clamp transistor 24 is to minimize the time during which the voltage o input node 14 will droop due to charge-sharing after connection to a bit line containing a memory cell. When a bit line is switched into connection with the input node 14, its voltage is usually low, nearly zero. When the connection is made from the bit line to input node 14, charge-sharing will take place and will lower the voltage on input node 14, approximately 250 mv with the clamp. When this occurs, the voltage at output node 22 will rise and N-channel clamp transistor 24 will turn on hard to limit the drop by supplying current to the input node 14 to make up for the droop caused by the charge-sharing with the bit line. In the absence of N-channel clamp transistor 24, it would take longer to recover from this condition and the voltage at output node 22 would not be valid until the input node 14 recovered from the charge-sharing and either returned to its quiescent state or sensed cell current flow.

Figure 1:
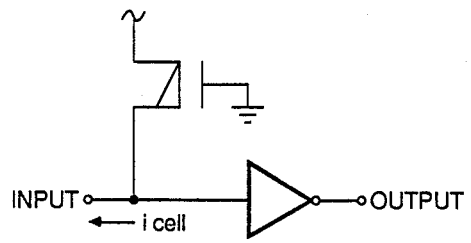
FIG. 1 is a schematic diagram of a single-ended prior art sense amplifier.
Figure 2:
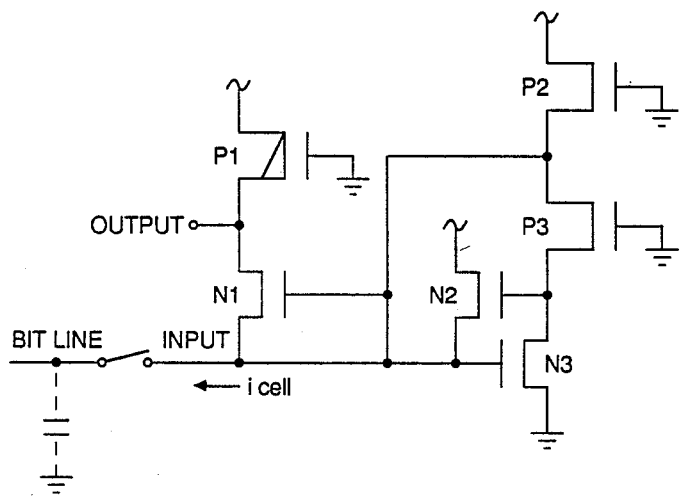
FIG. 2 is a schematic diagram of a prior art single-ended current to voltage converter sense amplifier.

This clamp also reduces switching delay further because the clamp trip point is the same as the sense amp trip point; so no time is wasted while the I/O line moves between the clamp and sense trip points, as happened in the case of the sense amp in FIG. 2.

One technique to increase the noise immunity of amplifier 10 is to adjust the ratio of first P-channel MOS transistor 12 and first N-channel MOS transistor 16 to adjust the trip point to some fraction of the cell current. For example, if the design had more VSS noise than VDD noise, due to output buffers switching low faster than they switch high, then the trip point should be increased to compensate to re-optimize the noise immunity of the sense amp for the larger negative supply noise source. If VSS and VDD noise was equal, then the trip point should be set at about half the minimum cell current for optimum noise immunity.

Another technique for obtaining a greater degree of noise immunity is to employ a capacitive voltage divider, including parasitic capacitor 26 (shown in dashed lines) connected between input node 14 and Vss and P-channel gate capacitor 28 shown connected between input node 14 and Vdd. The capacitance ratio between capacitors 26 and 28 should be chosen to give the same voltage divider ratio as the voltage divider ratio resulting from first P-channel MOS transistor 12 and first N-channel MOS transistor 16. The effect of this capacitive voltage divider circuit is to cancel high frequency voltage supply noise. If the voltage supply has a noise spike, the capacitive divider moves the input node bias voltage so that it tracks the trip point of the current mirrors. Since the noise current comes through the capacitive divider instead of the current mirrors (because the capacitors have a much wider band width then the current mirrors), the noise spike will not trip the sense amplifier nor will time be wasted in reestablishing bias levels.

In the example shown in FIG. 3, it is assumed that a certain amount of parasitic capacitance exists between input node 14 and Vss forming one leg of the capacitive voltage divider, and that a capacitive structure 28 will have to be included in the circuit between input node 14 and Vdd to form the other leg of the capacitor voltage divider. In some cases, depending on the design and layout, the parasitic capacitance may exist between input node 14 and Vdd. In such a situation, an NMOS gate capacitor, added between input node 14 and Vss will complete the other leg of the voltage divider. In general, the components of the capacitive voltage divider can be parasitics, or added devices (MOS transistors, diodes, metal plate capacitors, polysilicon place capacitor, etc.).

What is claimed is:

1. A high speed static single ended sense amplifier, including,
   an input node,
   an output node,
   a first P-channel input transistor having its source connected to a source of positive voltage, its drain connected to said input node and its gate connected to a feedback node,
   a first N-channel input transistor having its drain connected to said input node, its source connected to a source of negative voltage and its gate connected to said feedback node, a first output P-channel transistor having its source connected to a source of positive voltage, its drain connected to said output node, and its gate connected to said feedback node, a first N-channel output transistor having its drain connected to said output node, its source connected to a source of positive voltage and its gate connected to said feedback node, an N-channel feedback transistor having its gate connected to said output node, its drain connected to a source of positive voltage and its source connected to said feedback node, a capacitive voltage divider connected between said source of negative voltage, said source of positive voltage, and said input node, said capacitive voltage divider including a parasitic capacitance and a P-channel gate capacitor connected between said input node and one of said positive or negative voltage sources, the capacitance ratio of said capacitive voltage divider being such as to give the same voltage divider ratio as the voltage divider ratio resulting from first P-channel MOS input transistor and first N-channel MOS input transistor.

2. A high-speed, static, single-ended sense amplifier, including:
 a sense amplifier input node,
 a sense amplifier output node,
 a set of two complimentary unbalanced current mirrors, each of said current mirrors in said set having an input node and an output node, said set of complementary unbalanced current mirrors having their unput nodes connected together to said sense amplifier input node and their output nodes connected together to said sense amplifier output node,
 a feedback voltage clamp connected between said sense amplifier output node and said sense amplifier input node.

3. The high-speed, static, single-ended sense amplifier of claim 2, further including a capacitive voltage divider on said sense amplifier input node.

* * * * *